United States Patent
Rieger et al.

(10) Patent No.: US 10,318,697 B2
(45) Date of Patent: *Jun. 11, 2019

(54) SUB-RESOLUTION ASSIST FEATURE IMPLEMENTATION FOR SHOT GENERATION

(71) Applicant: Synopsys, Inc., Mountain View, CA (US)

(72) Inventors: Michael Lawrence Rieger, Skamania, WA (US); Thomas Christopher Cecil, Menlo Park, CA (US); Benjamin David Painter, Portland, OR (US)

(73) Assignee: SYNOPSYS, INC., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/289,919

(22) Filed: Oct. 10, 2016

(65) Prior Publication Data

US 2017/0032076 A1 Feb. 2, 2017

Related U.S. Application Data

(63) Continuation of application No. 14/922,569, filed on Oct. 26, 2015, now Pat. No. 9,471,746, which is a (Continued)

(51) Int. Cl.
  *G06F 17/50* (2006.01)
  *G03F 1/36* (2012.01)
  *G03F 1/70* (2012.01)

(52) U.S. Cl.
  CPC ........... *G06F 17/5081* (2013.01); *G03F 1/36* (2013.01); *G03F 1/70* (2013.01); *G06F 17/5072* (2013.01)

(58) Field of Classification Search
  CPC ..... G03F 1/36; G03F 1/70; G03F 1/30; G03F 7/70625; G03F 1/68; G03F 7/2063;
  (Continued)

(56) References Cited

U.S. PATENT DOCUMENTS 7,579,606 B2  8/2009  Yoshida et al.
7,698,665 B2  4/2010  Abrams et al.
(Continued)

OTHER PUBLICATIONS

Kim, et al., "Inverse lithography technology (ILT): What is the impact to the photomask industry?", *Proc. SPIE*, vol. 6283, (2006).
(Continued)

*Primary Examiner* — Binh C Tat
(74) *Attorney, Agent, or Firm* — Alston & Bird LLP

(57) ABSTRACT

A design layout for a semiconductor chip includes information on shapes desired to be fabricated. Clusters of photolithographic exposure "shots" are generated and subject to a measure of shot density to approximate a mask shape that generates the desired fabricated shapes when exposed during wafer fabrication. A simulation is run on the clusters of shots to estimate the resulting fabrication shapes that the clusters of shots create. The clusters of shots are modified to align the estimated fabrication shapes more closely with desired fabrication shapes. The process of simulating and modifying the shots is iterative, repeating until the estimated fabrication shapes are within a desired error difference of the planned fabrication shape.

28 Claims, 10 Drawing Sheets

Related U.S. Application Data continuation of application No. 14/213,813, filed on Mar. 14, 2014, now Pat. No. 9,170,481.

(60) Provisional application No. 61/786,266, filed on Mar. 14, 2013, provisional application No. 61/846,457, filed on Jul. 15, 2013.

(58) Field of Classification Search
CPC ........ G03F 7/705; G03F 7/70516; G03F 1/26; G03F 7/70425; G03F 1/84; G06F 17/5081; G06F 17/50; G06F 2217/12; G06F 17/5068; G06F 17/5072; G06F 17/5036; H01L 27/11803; H01L 27/11807; G06K 9/00; G06T 2207/30148; H01J 2237/2817
USPC ...................................... 716/50–56
See application file for complete search history.

(56) References Cited

U.S. PATENT DOCUMENTS

| | | | |
|---|---|---|---|
| 7,745,078 B2 | 6/2010 | Fujimura et al. | |
| 7,747,977 B1 | 6/2010 | Lapanik et al. | |
| 7,754,401 B2 | 7/2010 | Fujimura et al. | |
| 7,759,026 B2 | 7/2010 | Fujimura et al. | |
| 7,759,027 B2 | 7/2010 | Fujimura et al. | |
| 7,772,575 B2 | 8/2010 | Yoshida et al. | |
| 8,108,802 B2 | 1/2012 | Rosenbluth et al. | |
| 8,266,556 B2 | 9/2012 | Liu et al. | |
| 9,170,481 B2 * | 10/2015 | Rieger | G03F 1/36 |
| 9,471,746 B2 * | 10/2016 | Rieger | G03F 1/36 |
| 2002/0042007 A1 | 4/2002 | Miyazaki et al. | |
| 2007/0162887 A1 | 7/2007 | Suh et al. | |
| 2011/0004856 A1 | 1/2011 | Granik et al. | |
| 2012/0117520 A1 | 5/2012 | Kitamura et al. | |
| 2014/0282290 A1 * | 9/2014 | Rieger | G03F 1/36 716/51 |

OTHER PUBLICATIONS

Pierrat, et al., "Impact of model-based fracturing on e-beam proximity effect correction methodology," SPIE Photomask Technology, International Society for Optics and Photonics, (2010).

Fujimura, et al., "Best depth of focus on 22-nm logic wafers with less shot count," Photomask and NGL Mask Techology XVII, International Society for Optics and Photonics, (2010).

Fujimura, "Circles: One Key to Successful Lithography at Advanced Nodes," eBeam Initiative, (Feb. 23, 2010).

Fujimura, et al., "Efficiently writing circular contacts on production reticle," Photomask and NGL Mask Technology XVII, International Society for Optics and Photonics, (2010).

Fujimura, "Design for E-Beam: Getting the Best Wafers Without the Exploding Mask Costs," eBeam Initiative, (Mar. 24, 2010).

U.S. Appl. No. 14/922,569, Non-Final Office Action dated Dec. 21, 2015.

U.S. Appl. No. 14/922,569, Notice of Allowance dated Jun. 27, 2016.

U.S. Appl. No. 14/213,813, Non-Final Office Action dated Jul. 31, 2014.

U.S. Appl. No. 14/213,813, Final Office Action dated Feb. 18, 2015.

U.S. Appl. No. 14/213,813, Notice of Allowance dated Jul. 22, 2015.

* cited by examiner

SUB-RESOLUTION ASSIST FEATURE IMPLEMENTATION FOR SHOT GENERATION

RELATED APPLICATIONS

This application is a continuation of U.S. patent application "Sub-Resolution Assist Feature Implementation With Shot Optimization" Ser. No. 14/922,569, filed Oct. 15, 2015, which is a continuation of U.S. patent application "Sub-Resolution Assist Feature Implementation Using Shot Optimization" Ser. No. 14/213,813, filed Mar. 14, 2014 which claims the benefit of U.S. provisional patent applications "Shot-Optimized Mask Synthesis" Ser. No. 61/786,266, filed Mar. 14, 2013 and "Sub-Resolution Assist Feature Implementation Using Shot Optimization" Ser. No. 61/846,457, filed Jul. 15, 2013. The foregoing applications are each hereby incorporated by reference in their entirety.

FIELD OF ART

This application relates generally to semiconductor design and more particularly to mask generation for use in the fabrication of semiconductor devices.

BACKGROUND

The design and fabrication of an integrated circuit involves many different steps, many of which are commonly performed using electronic design automation (EDA) tools running on a computer. Frequently, millions and even billions of transistors can exist on a single semiconductor chip. Each transistor is composed of shapes, each for a specific function such as diffusion, polysilicon, contacts, metallization, and other structures. Other structures can be created to connect the transistors or to form other circuit elements, such as capacitors. Going through the various steps in the design process requires an understanding of the limitations of the manufacturing process. Shapes must be designed in such a way that, after the shapes are physically fabricated on a circuit, the electronic circuit functions correctly and according to specifications.

On each semiconductor chip there are numerous structures of miniscule dimension comprised of various materials in close proximity to one another. Each of those structures has a desired shape, which can be Manhattan shapes (i.e. polygons with orthogonal edges) in many cases, but also can be any arbitrary shape. The structures are formed using many different techniques. Photolithography is commonly used to create structures in the chip. One photolithographic technique for forming a set of structures in a particular layer of a chip is to deposit a layer of material and then to coat the layer with a photosensitive material. A mask is etched with a variety of shapes designed to facilitate the selective exposure of certain shapes on the photosensitive layer. Light is then shone through the mask, exposing the areas of the photosensitive material not shielded by the shapes in the mask. The exposed areas of the photosensitive material, along with, in some cases, the layer of material below those exposed areas, are then etched away. After the unexposed photosensitive material is removed, the desired structures remain. Though this is a potential semiconductor fabrication technique, many other techniques can be used to form structures in the semiconductor chip. Many of these techniques use masks, where the masks can include one or more shapes that are used to indirectly or directly create the structures on the chip. The shapes on the mask may or may not represent shapes of actual structural forms; they can have a shape that is dictated by the fabrication process and the desired shapes of the structures to be formed.

As technologies have advanced, creating semiconductors with smaller and smaller dimensions, also called feature sizes, have become a necessary part of the lithographic, mask-based fabrication process. Because lithography uses electromagnetic radiation (EMR), such as visible light or ultraviolet light, to selectively expose areas of the chip through a mask, the wavelength of the EMR directly limits potential feature sizes. For example, if the dimensions of desired features are smaller than the wavelength of the EMR used, there can be harmful interactions between the mask and the EMR, which may impact the actual shapes of the exposed areas and result in exposed shapes different from the shapes on the mask. To accommodate this, the desired shape of the final exposed area can be used to generate a desired shape of a mask element, which can be different than the desired shape of the final exposed area. In some cases, this may create mask elements with complex, non-rectilinear shapes.

SUMMARY

A layout for a semiconductor chip includes desired fabricated shapes. Clusters of shots may be generated, subject to a shot density, to approximate an estimated mask shape that could be used to generate the desired fabricated shapes. A simulation is then run using the clusters of shots to estimate the fabrication shapes the clusters of shots would create if exposed. The clusters of shots may then be modified to make the estimated fabrication shapes more closely match the desired fabrication shapes. The process of simulation and modification of the shots may be repeated until the estimated fabrication shapes are within an acceptable error difference of the desired fabrication shape. A computer-implemented method for shape analysis is disclosed comprising: obtaining a semiconductor design layout; determining a desired fabricated shape corresponding to the semiconductor design layout; evaluating the semiconductor design layout to determine mask shapes; establishing a shot density for shots used to generate the mask shapes; approximating the mask shapes using the shots; estimating a resulting fabricated semiconductor layout based on the shots; and modifying the shots to make the resulting fabricated semiconductor layout to be closer to the desired fabricated shape. The method can further comprise obtaining a library of pre-determined shot clusters representing a plurality of assist shapes for the mask shapes. Pre-determined shot clusters that comprise one or more mask shapes may comprise glyphs. The method may further comprise controlling a variably shaped beam based on the shots. The method may further comprise determining a required minimum shot configuration for the shots. The method may further comprise transferring glyph indices from an OPC tool to a mask writer wherein the glyph indices are based on the shots.

In some embodiments, a computer-implemented method for shape analysis comprises: establishing a shot density for shots used to generate mask shapes; approximating the mask shapes using shots based on the shot density; estimating a resulting fabricated semiconductor layout based on the shots; and modifying the shots to make the resulting fabricated semiconductor layout to be closer to a desired semiconductor fabricated shape. In embodiments, a computer system for shape analysis comprises: a memory which stores instructions; one or more processors coupled to the memory wherein the one or more processors are configured to: obtain a semiconductor design layout; determine a desired fabricated shape corresponding to the semiconductor design layout; evaluate the semiconductor design layout to determine mask shapes; establish a shot density for shots used to generate the mask shapes; approximate mask shapes using the shots; estimate a resulting fabricated semiconductor layout based on the shots; and modify the shots to make the resulting fabricated semiconductor layout to be closer to the desired fabricated shape. In some embodiments, a computer program product embodied in a non-transitory computer readable medium for shape analysis comprises: code for obtaining a semiconductor design layout; code for determining a desired fabricated shape corresponding to the semiconductor design layout; code for evaluating the semiconductor design layout to determine mask shapes; code for establishing a shot density for shots used to generate the mask shapes; code for approximating mask shapes using the shots; code for estimating a resulting fabricated semiconductor layout based on the shots; and code for modifying the shots to make the resulting fabricated semiconductor layout to be closer to the desired fabricated shape.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
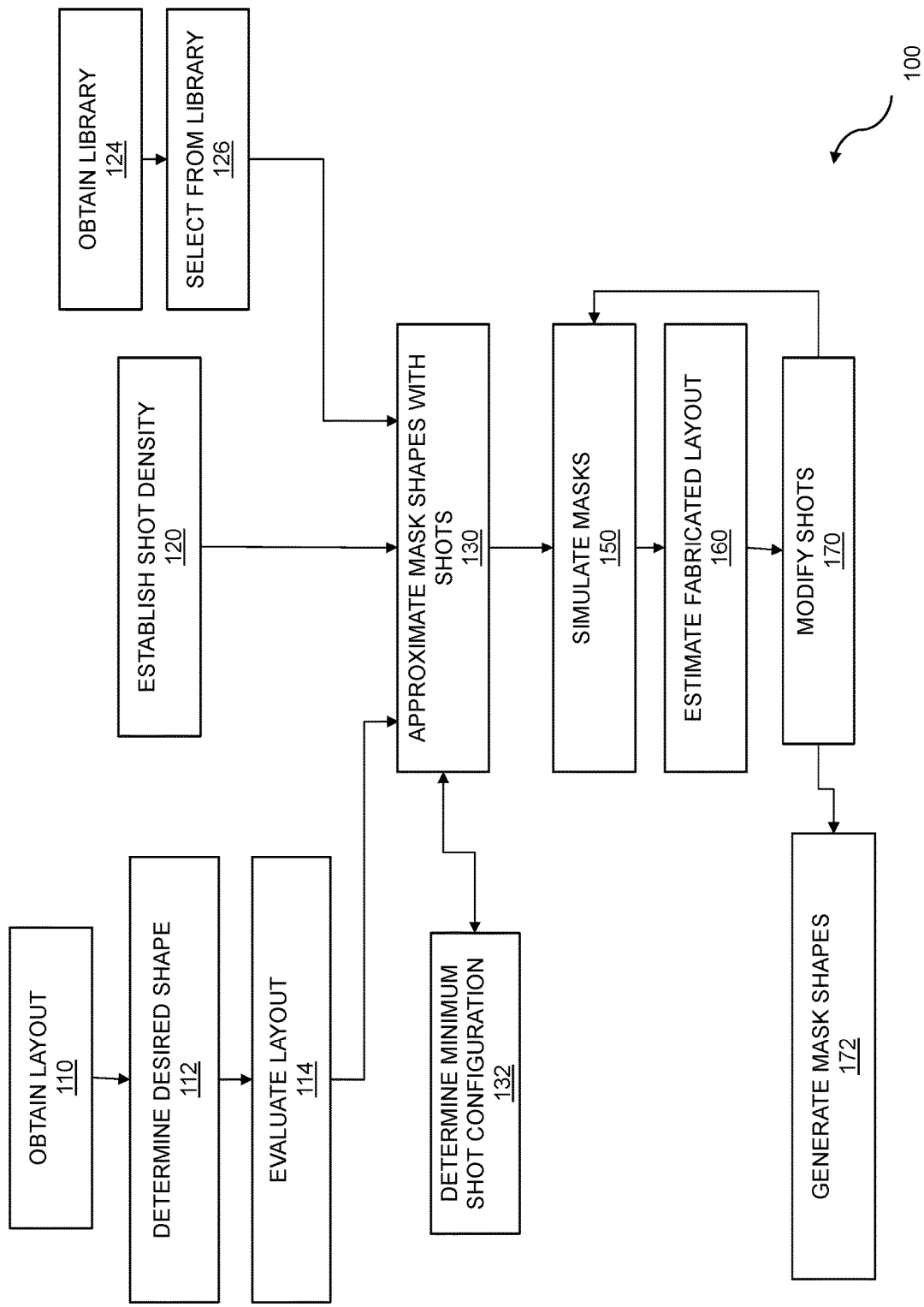
FIG. 1 is a flow diagram for shot-optimized mask synthesis.

Huge numbers of semiconductor devices can be used to build an integrated circuit (IC), which also can be referred to as an electronic design, a semiconductor chip, or simply a chip. As the number of devices grows, the physical dimensions, or "feature sizes," of individual devices decrease. The minimum feature sizes of stable or mature fabrication processes are typically smaller than the wavelength of visible light, or even ultraviolet light. Many of these advanced technologies are fabricated using processes based on lithographic and chemical processing. However, successful optical lithography is becoming increasingly difficult to attain.

One way that designers stretch the usefulness of currently available wavelengths of visible light is by carefully controlling mask shapes. Advanced process-window optimization methods, such as ILT (inverse lithography technology), generate finely articulated mask features that comprise a large number of primitive mask-writer features (called "shots"). As mask writing time is proportional to the number of features written, and over fifty percent of mask cost is proportional to write time, reducing the number of required shots lowers mask cost and improves turnaround time.

Methods described herein iteratively optimize shots to generate masks that create fabricated feature shapes that more closely match the desired feature shapes of the design. ILT and/or optical proximity correction (OPC) techniques can be used in the optimization loop to modify the shots. In some embodiments, the shots may be allowed to overlap each other to allow for further optimization. Putting shot creation into the OPC/ILT loop enables a maximum-process-window mask configuration with a minimum number of shots. In other words, instead of manipulating polygon edges, as in conventional OPC/ILT, the disclosed OPC-ILT loop enables the manipulation of the size and shape of mask writer shots. Additionally, the ILT/OPC lithography model can be augmented with a mask simulation model capable of predicting the mask layout for a configuration of shots. The output of the mask simulation model can then be provided to a wafer lithography simulation model to produce feedback for the wafer-image optimizer.

The methods described herein leverage the fact that for any shape instance there is typically a range of mask shapes that yield the same optimal performance within the constraints of the optical lithography system. By first constraining the shot density to a pre-defined value, a fixed-cost, optimal quality of result (QoR) solution can be determined. Conversely, a user-specified QoR goal can be specified, and the required minimum shot configuration can be resolved through the optimization loop. In all scenarios, bypassing the polygon as an intermediate representation of the mask layout pattern allows shot configurations to be optimized and to overlap, thus increasing the degrees of freedom for determining a minimum shot configuration.

Advanced OPC and ILT techniques produce finely articulated mask features, including sub-resolution assist features (SRAF) that can require a large number of mask writer "shots" to generate. Writing time is proportional to the number of shots, and a large part of mask cost is proportional to write time. The methods described herein achieve optimum lithography performance of the mask with the least possible number of shots, and thereby realize the lowest mask cost.

At a high level, sub-resolution assist feature (SRAF) implementation using shot optimization starts with a layout that includes desired fabricated shapes. Clusters of shots can be generated and subject to a shot density, in order to approximate an estimated mask shape that could be used to generate the desired fabricated shapes. A mask simulation is then run with the clusters of shots to estimate fabrication shapes that can be created using the clusters of shots. The clusters of shots can then be modified to more closely match the estimated fabrication shapes to the desired fabrication shapes. The process of mask simulation and modification of the shots can be repeated until the estimated fabrication shapes are within a desired error difference of the pre-planned fabrication shape.

FIG. 1 is a flow diagram for shot-optimized mask synthesis. The flow 100 describes a computer-implemented method for shape analysis. The flow includes obtaining a semiconductor design layout 110. The layout can be obtained by reading one or more computer files from computer storage media, by using a logical design to generate a physical design layout, by user entry, by receiving a communication over a communications link, by scanning images of masks for various layers of the design, or by any other method. The layout can include information about various layers of the chip and/or masks used for various process steps of the fabrication process used to manufacture the chip. In some embodiments, the layout can include graphic data system II (GDSII) data.

The flow 100 includes determining a desired fabricated shape 112 corresponding to the semiconductor design layout. The semiconductor design layout can include one or more shapes that are used in one or more process steps during fabrication of an integrated circuit (IC) or semiconductor chip. In some embodiments, the semiconductor design layout can match the desired fabricated shapes. In some embodiments, at least some of the shapes are modified, or pre-compensated, for various fabrication processes and may not match the desired fabricated shape in a finished chip. If the shapes in the layout do not match the desired fabricated shape, the layout can be analyzed to determine the final desired fabricated shapes.

The flow 100 includes evaluating the semiconductor design layout 114 to determine mask shapes. A mask shape can be determined based on the desired fabricated shape. Any method can be used to determine mask shapes. In some embodiments, mask shapes are determined based on stored mask shapes retrieved from a database or a library. The ultimately desired fabrication shape can be used as a key to lookup a mask shape in the database. In some embodiments, one or more rules can be used to generate a mask shape starting from a desired completed fabrication shape. In some embodiments, optical proximity correction (OPC) techniques and/or inverse lithography technology (ILT) are used to determine a mask shape, while in still other embodiments, the mask shape includes an assist feature, and the assist feature can include a sub-resolution assist feature (SRAF) shape.

The flow 100 includes establishing a shot density 120 for shots used to generate the mask shapes. The shot density can determine a maximum number of shots that can be used per unit area and can be based on many different factors, such as, but not limited to, the type of equipment used in the fabrication process, the minimum feature size, a cost target, and a time-per-mask target. The flow 100 includes obtaining a library 124 of pre-determined shot clusters representing a plurality of assist shapes for the mask shapes and selecting, from the library, an assist shape 126 from the plurality of assist shapes where the assist shape is based on the semiconductor layout. In some embodiments, assist shapes are not included in the semiconductor design layout, but can be helpful to create a feature in the final semiconductor chip that is more closely matched to the desired fabricated shape than would be possible without an assist shape.

The flow 100 includes using shots to approximate mask shapes 130. The approximating may be based on ILT, in some embodiments. A shot can be defined as a rectangular element generated by the photolithographic equipment and designed to produce structures, where the size and location of the structures is carefully controlled. In embodiments, a plurality of shots are used to construct a shape in a mask. Shots can be used to generate a sub-resolution assist feature (SRAF) shape, or any other shape in the mask. Shots overlap in some embodiments. Many different combinations of shots can be defined in order to create a single mask shape. The shot density can be used to determine how many different shots are necessary to create a given mask shape. In this manner, required minimum shot configuration 132 can be determined for the shots. In some embodiments, the required minimum shot configuration represents the smallest number of shots that can adequately represent a mask shape. In other embodiments, a polygonal shape is defined based on a non-polygonal mask shape combined with the polygonal shape used to define the shots, but in other embodiments, shot creation can entirely bypass polygon shape generation.

The flow 100 includes simulating masks 150. The simulating can involve evaluating how the various steps of the intended fabrication process might interact with the masks to induce changes on the semiconductor wafer. Various aspects of the photolithographic process can also be simulated as a part of simulating the masks, such as simulating how the wavelength of the light used to expose the chip interacts with the mask and produces diffraction-related blurring and under-exposure of the photoresist. The flow 100 includes estimating a resulting fabricated semiconductor layout 160 based on the shots. The estimating can use the results of the mask simulation to predict the layout of the ultimately fabricated shapes on a chip. The flow 100 includes modifying the shots 170 to more closely match the fabricated semiconductor layout to the ultimately desired fabricated shape. Any method can be used to determine how to modify the shots, such as computational lithography, optical proximity correction (OPC), inverse lithography technology (ILT), or any other method. The modifying of the shots is based on enhancing focus variability capabilities, in at least some embodiments. The masks can be simulated 150 again, and the fabricated layout can be estimated 160 another time, based on the modified shots. This process can be repeated any number of times to produce an estimated fabricated layout that is close to the ultimately desired fabricated shape.

The flow 100 includes generating mask shapes 172 for use in the fabrication of an integrated circuit. This can include generating the mask shapes 172 based on the assist feature, although in some embodiments, the assist shape does not appear on a physical chip which is generated based on the semiconductor layout. The generating of the mask shapes 172 can be based on the shot density for the shots for a semiconductor mask. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
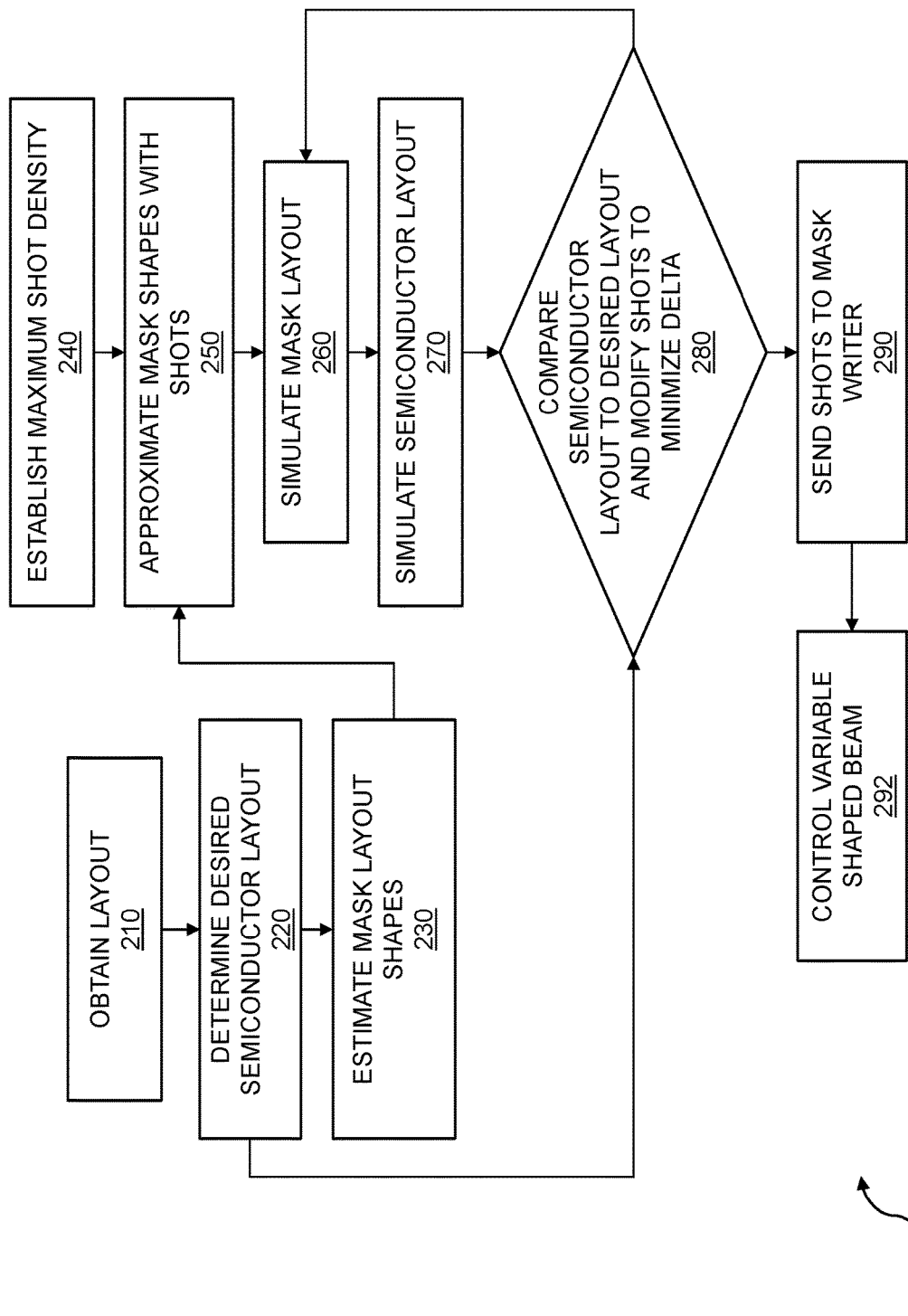
FIG. 2 is a flow diagram for shot optimization.

FIG. 2 is a flow diagram for shot optimization. The flow 200 includes obtaining a layout 210, which can be done by any method, including those described above, but is obtained by reading a file from a hard disc in some embodiments. A desired semiconductor layout is determined 220 based on the obtained layout. The desired semiconductor layout can include a plurality of structural shapes slated for inclusion in the fabricated integrated circuit (IC). Mask layout shapes can be estimated 230 based on the desired structural shapes. The estimated mask layout shapes can be based on ILT using the desired fabricated shapes; calculated using rule-based construction working backwards from the desired shapes at the end of fabrication; or obtained from a library, such as a library of glyphs. In embodiments, the estimated shapes include one or more assist shapes, which in turn can include one or more SRAFs. A maximum shot density can be established 240. The maximum shot density can be read from a configuration file, can be set by a user input, or can be calculated based on one or more factors, such as the type of photolithography equipment to be used and/or minimum feature size.

Mask shapes can be approximated using shots 250. The approximation can involve selecting a set of rectangles representing shots to approximate the estimated mask shapes. In embodiments, the mapping remains equal to or below maximum shot density to allow the shots to function within the established shot density. If the estimated mask shapes include an assist shape, the assist shape can be used in the approximating of the mask shapes. The mask shapes can include assist features comprising sub-resolution assist features (SRAF), so that in embodiments the approximating approximates the assist features with shots. In some embodiments, the approximating includes using rule-based evaluation of the mask shapes. Thus, the shots can use the shot density that was established.

The mask layout can be simulated 260. The mask simulation can include a model of the electron beam or laser beam exposure image. The mask simulation can also include a model of the resist activation and development for the mask process. The mask simulation can further include a model of the mask etch process. The simulation of the mask layout can be used in an analysis of the semiconductor layout 270. A lithography simulator predicts the structural shapes produced by the simulated mask layout 260, which allows the shapes to be placed together to form a completed simulation of a fabricated layout 270. The simulated semiconductor layout can be compared to the desired semiconductor layout and the shots can be modified to minimize the delta (or differences) between the two layouts 280. The modified shots can then be simulated 260, and a new simulated semiconductor layout 270 generated and compared to the desired layout 280 in a loop that can be repeated until the delta is within a predetermined level, a predetermined number of passes through the loop have been made, or until some other criteria is met.

The shots can be sent to a mask writer 290 to fabricate a semiconductor chip. As a step in the chip fabrication process, a variable beam can be controlled 292. So, the flow 200 includes controlling a variable shaped beam based on the shots. In at least one embodiment, the variably shaped beam comprises a charged particle beam. The fabrication process can involve many different steps, some of which utilize a mask that can be based on shots, and some of which do not use a mask, or use a mask created in some other manner. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
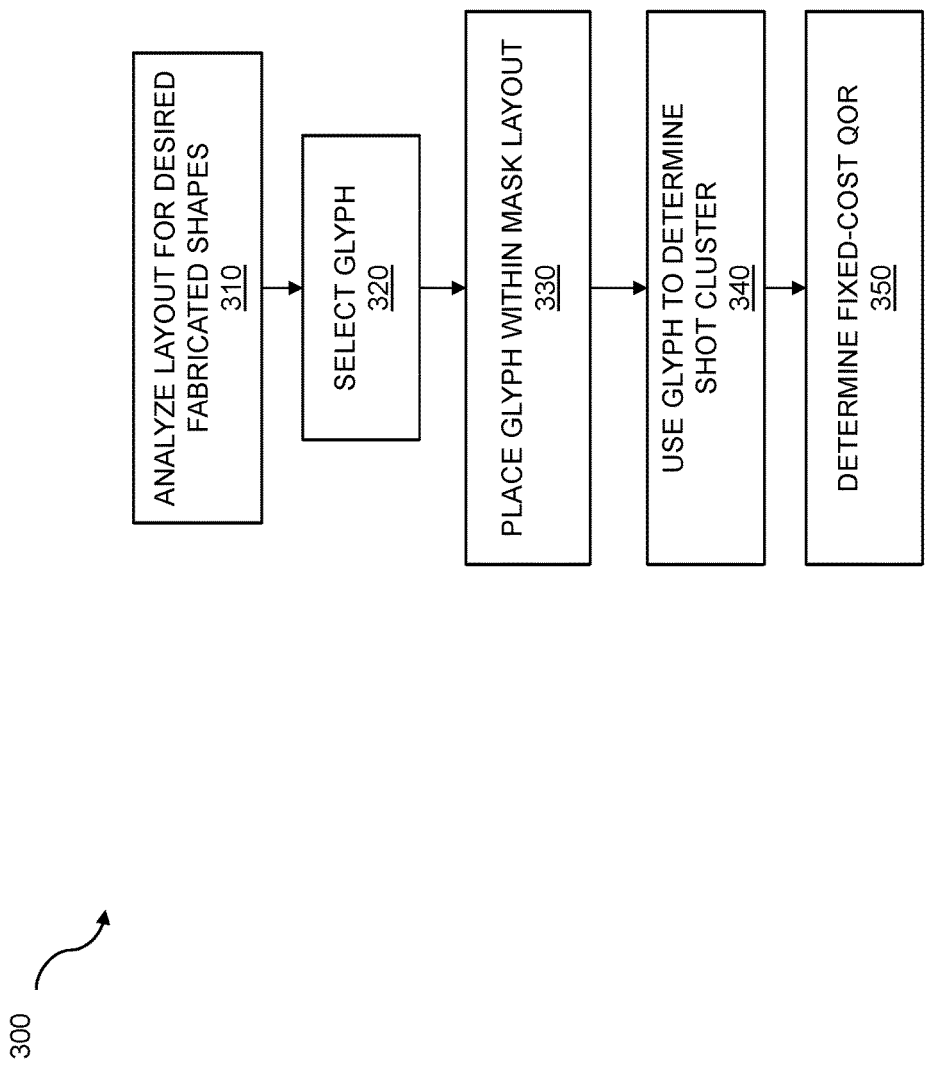
FIG. 3 is a flow diagram for assist feature determination.

FIG. 3 is a flow diagram for assist feature determination. The flow 300 includes analyzing a layout for desired fabricated shapes 310. The fabricated shapes can represent structures on a fabricated IC, or can represent desired shapes of features to be created during the fabrication of the IC yet not present in the final IC; that is, shapes which are changed or removed by subsequent fabrication processes. The fabricated shapes can represent a desired shape of an exposed area of the IC that is used, in embodiments, to define an area to be etched, doped, implanted, or otherwise changed, even if no actual structure is created in the final IC with that shape.

A particular fabricated shape is used to select a glyph 320. A glyph is a shape, or set of shapes, that can be an estimate of a mask shape which can be used to create the final fabricated shape. The glyph can be selected from a library based on the particular fabricated shape. The glyph can include one or more assist features, such as a SRAF. So, the flow 300 can include selecting a glyph that approximates the assist shape. The flow 300 can also include placing the glyph within the layout of mask shapes 330. In some embodiments, the glyph includes the fabricated shape as a part of the glyph, but in other embodiments, the glyph is added to the desired fabricated shape to create the estimated mask shape.

The flow 300 includes using a glyph to determine a shot cluster 340. Pre-determined shot clusters including one or more mask shapes can comprise glyphs. In other embodiments, a cluster of shots can be generated to closely match the glyph based on a maximum shot density. Thus, the flow 300 can include using the glyph which was placed within the mask shapes in determining of the shots, and can include analyzing the semiconductor layout to evaluate desired fabricated shapes using the assist feature to aid in fabrication of the desired fabricated shapes. The flow 300 can also include determining a fixed-cost, optimal quality of result (QoR) solution 350 for the shots. Various steps in the flow 300 may be changed in order, repeated, omitted, or the like without departing from the disclosed concepts. Various embodiments of the flow 300 may be included in a computer program product embodied in a non-transitory computer readable medium that includes code executable by one or more processors.

Figure 4:
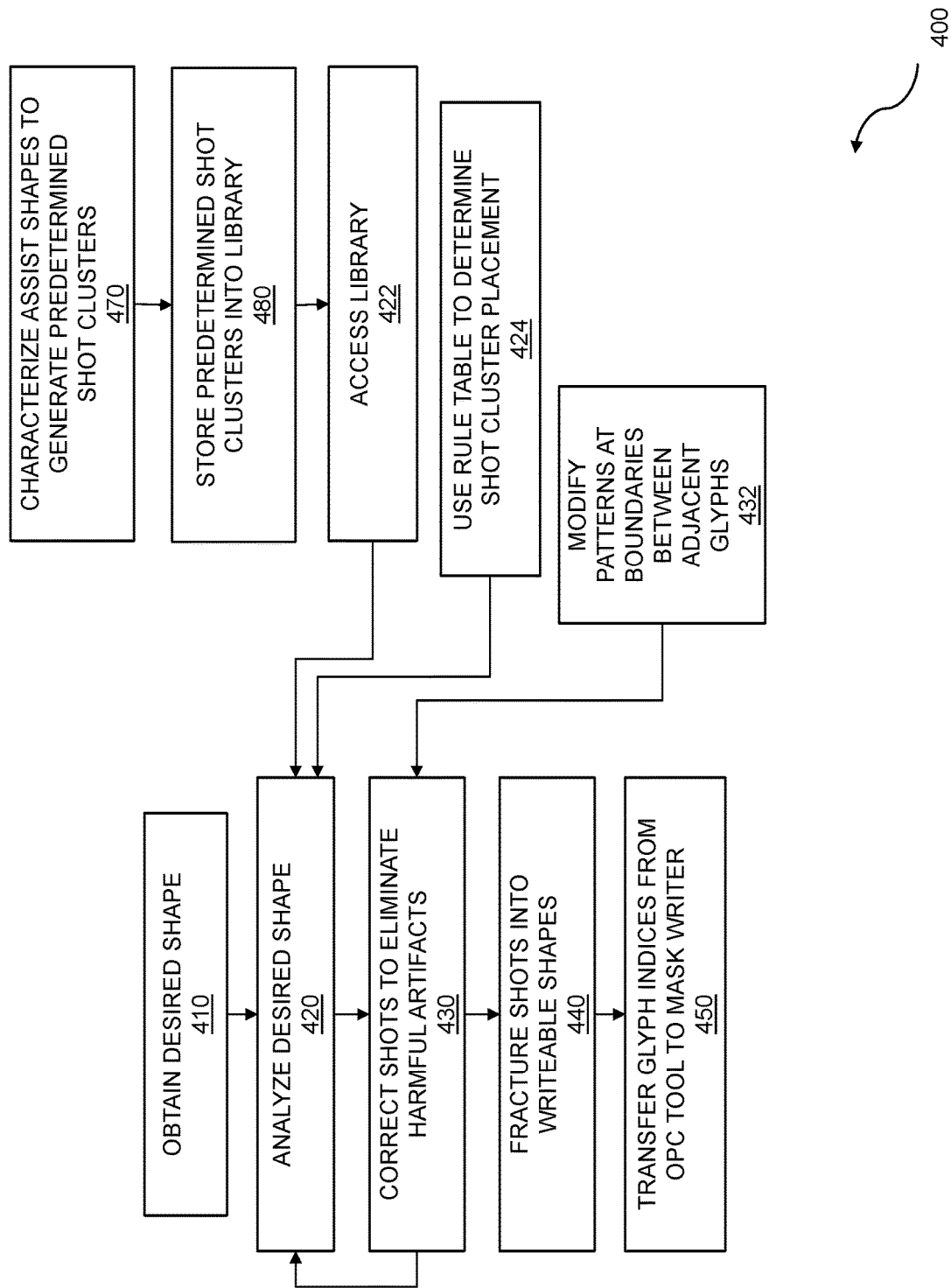
FIG. 4 is a flow diagram for shot analysis and storage.

FIG. 4 is a flow diagram for shot analysis and storage. The flow 400 includes obtaining a desired shape 410. The desired shape can be obtained from a layout in some embodiments. The flow 400 includes having the desired shape analyzed 420. The analyzing can include accessing a library 422 to retrieve assist shapes that could prove helpful in the generation of the desired shape. In some embodiments, the analyzing includes the use of a rule table to determine placement of shot clusters 424, with the clusters comprised of the shots corresponding to the desired shape. In embodiments, the analyzing results in shot clusters can represent one or more glyphs, which in turn can combine to represent a mask shape for the desired shape, which can include assist shapes. The flow 400 can include characterizing the shots to generate pre-determined shot clusters 470, and storing the pre-determined shot clusters into a library 480. Some shapes and/or glyphs can be commonly used and can take a non-trivial amount of computation to generate an optimum shot cluster for the shape. By pre-determining the shot clusters for the commonly used shapes and saving them in a library, the optimum cluster can be re-used multiple times without spending computational resources each time the shape occurs. Those shapes can then, in turn, be accessed 422 for use in obtaining the desired shapes.

The flow 400 includes correcting the shots to eliminate harmful artifacts 430, a process which can include modifying patterns for the shots at boundaries between adjacent glyphs 432. Other modifications of the shot clusters can be performed based on mask simulation, which can include OPC and/or ILT. The OPC can occur within a loop along with the estimating of the resulting fabricated semiconductor layout and the modifying of the shots. The loop can include using inverse lithography technology. The loop can further comprise a mask simulation. The loop can also include analyzing the desired shape 420.

Once the simulation has determined that the parameters necessary to exit the loop have been met, the flow 400 can continue by fracturing the shots into writeable shapes 440 and sending the newly-formed, writeable shots to a mask-writing tool. In some embodiments, the shots created during the loop will not be directly supported by the mask-writing tool—for example, the shots can comprise non-rectangular polygons—and thus are fractured into multiple rectangles. Once all the shots are rendered in a form writeable by the mask-writing tool, the flow 400 continues by transferring indices from an OPC tool to a mask writer 450 wherein the indices are based on the shots. The indices can be for shots or for glyphs. Thus, the flow can include transferring glyph indices from an OPC tool to a mask writer wherein the glyph indices are based on the shots. Various steps in the flow 400 may be changed in order, repeated, omitted, or the like without departing from the disclosed concepts. Various embodiments of the flow 400 may be included in a computer program product embodied in a non-transitory computer readable medium that includes code executable by one or more processors.

Figure 5:
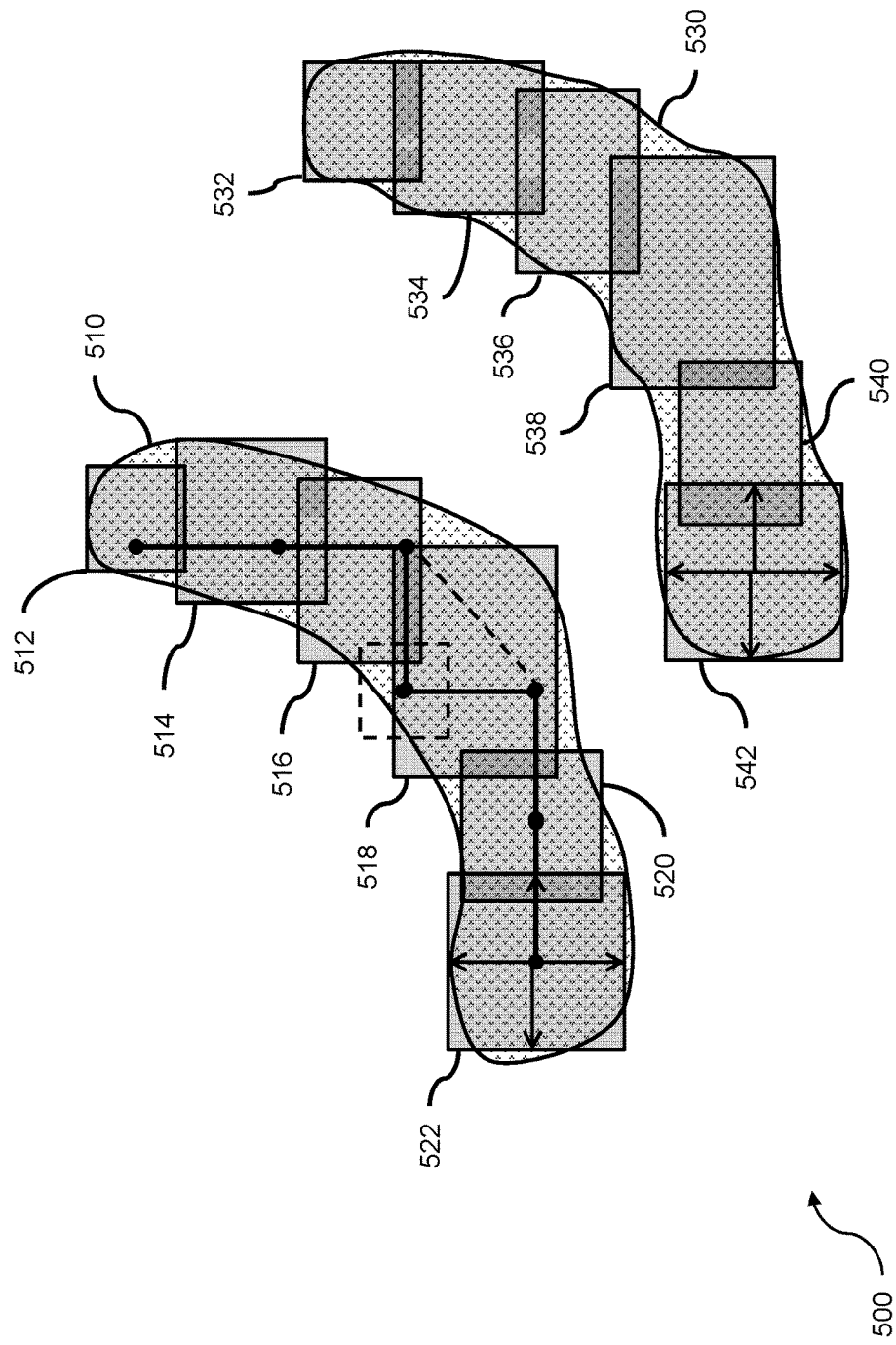
FIG. 5 shows example shapes evidencing mask-writer shot manipulation.

FIG. 5 shows example shapes evidencing mask writer shot manipulation 500. In the example 500, a starting mask shape 510 is obtained. The starting mask shape 510 can be obtained from a layout or by other method, such as by using ILT or a rule-based generation. In the example shown in FIG. 5, the starting mask shape is a sub-resolution assist feature (SRAF) generated by ILT. The starting mask shape 510 can be estimated as a cluster of shots. In the example shown, shot 512, shot 514, shot 516, shot 518, shot 520 and shot 522 comprise a cluster of shots that is used to approximate a starting mask shape 510 based on a shot density. Note that the shots were generated without first generating a polygon shape for the starting shape 510, so, in embodiments, the shots are created while bypassing polygon shape generation.

Once the cluster of shots has been generated, the mask layout can be simulated, and a wafer lithography model can be used to predict the lithographic result of the mask shapes. Based on the results of the simulation, the cluster of shots can be modified so that the predicted lithographic result better matches the desired shapes on the wafer. In the example shown, shot 512 is modified to be wider and taller, becoming shot 532, and shot 514 is modified to be narrower, becoming shot 534. Shot 516 and shot 518 are left unchanged, labeled shot 536 and shot 538. Shot 520 is modified to be shorter, becoming shot 540, and shot 522 is left unchanged as shot 542. The new shots 532-542 can be simulated to determine the new mask shape 530. The predicted mask shapes are then simulated with a lithography model to predict the shapes fabricated on the wafer, which can be compared to the desired semiconductor layout (not shown in the diagram). If it is determined that the shapes do not match well enough to meet requirements, modification of the shots, simulation, and comparison can be iterated until the shapes, when subject to lithographic simulation, produce a shape acceptable within design requirements. Then, the cluster of shots can be sent to a mask writer.

Once the cluster of shots has been sent to the mask writer, a variably shaped beam can be controlled based on the shots. Other embodiments will employ and control different types of beams, such as a fixed beam. The variably shaped beam is a charged particle beam in some embodiments, although other embodiments will utilize another type of beam, such as a beam of electromagnetic radiation.

Figure 6:
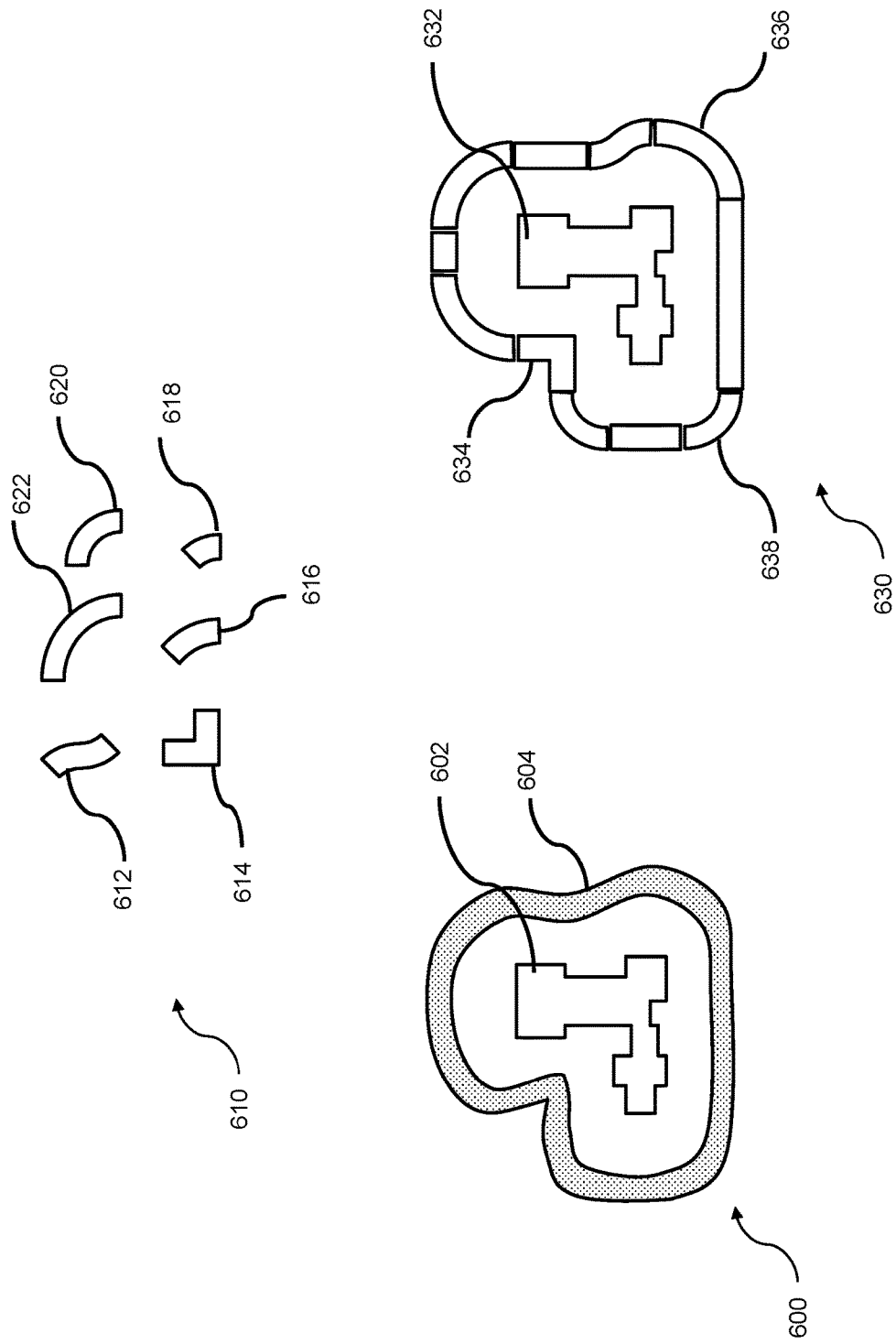
FIG. 6 shows examples of differing glyphs and usage.

FIG. 6 shows examples of differing glyphs and usage. Main shapes can be produced on masks, along with assist features, which enable the reliable production of needed shapes on wafers during semiconductor fabrication. An example set of shapes 600 is shown including a main shape 602 along with a sub-resolution assist feature shape 604. The main shape 602 and the sub-resolution assist feature shape 604 can be determined using inverse lithographic techniques or other methods. The sub-resolution assist feature shape 604 will not be produced on the wafer; it is only present to aid in the producing of the main feature 602 on the wafer. A group of glyphs 610 are shown that can be used to formulate the sub-resolution assist feature shape 604 or other assist features on a mask. The glyphs 610 can be part of a library and can be characterized in order to ensure repeatability in printing on a wafer. A group of shapes 630 are shown including the main shape 632 along with glyphs designed to make up the segments of the sub-resolution assist feature shape 604. A curved shape 638 can be selected from the group of glyphs 610 in the form of a curved glyph 620. A rectangular shape 634 can be selected from the group of glyphs 610 in the form of a rectangular glyph 614. A second, curved shape 636 can be selected from the group of glyphs 610 in the form of a curved glyph 622. Other glyphs for various shapes 612, 616, 618 can be included in the group of glyphs 610. Other glyph shapes or connectors between glyphs can be used to make up the remainder of the sub-resolution assist feature shape 604. In other words, shots may be used to generate the sub-resolution assist feature shape. These shapes should be considered as examples, not by way of limitation.

Figure 7:
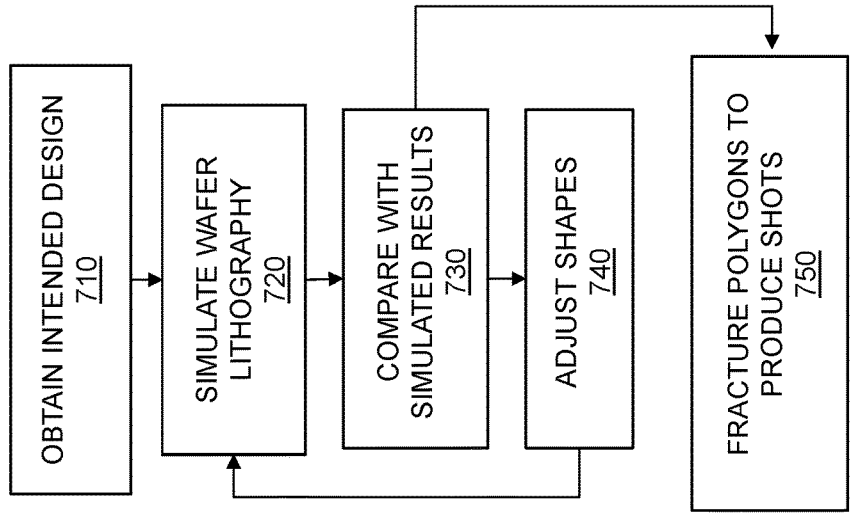
FIG. 7 is a flow diagram showing shot generation from polygons.

FIG. 7 is a flow diagram showing shot generation from polygons. The flow 700 includes obtaining an intended design 710. The design can be in any form, but can include a layout. The layout of the intended design will include polygonal shapes, or polygons, in some embodiments, although other embodiments will generate polygonal shapes to approximate curved shapes in the design. The flow 700 continues by simulating wafer lithography 720 using the design to determine simulated lithographic shapes and then comparing the intended designs with the simulation results 730. If the results are not close enough to the intended design to meet requirements, the polygonal shapes can be adjusted 740 and the new shapes run through the mask simulator 720 and re-compared to the intended design 730 until the simulation results are close enough to the intended design to meet design requirements. Thus, a design modification loop can further comprise a mask simulation.

Once the simulation results are close enough to the intended design to meet design requirements, the polygons can be fractured to produce shots 750. The shots can be rectangles of various sizes and locations. The shots will overlap in some embodiments. Various steps in the flow 700 may be changed in order, repeated, omitted, or the like without departing from the disclosed concepts. Various embodiments of the flow 700 may be included in a computer program product embodied in a non-transitory computer readable medium that includes code executable by one or more processors.

Figure 8:
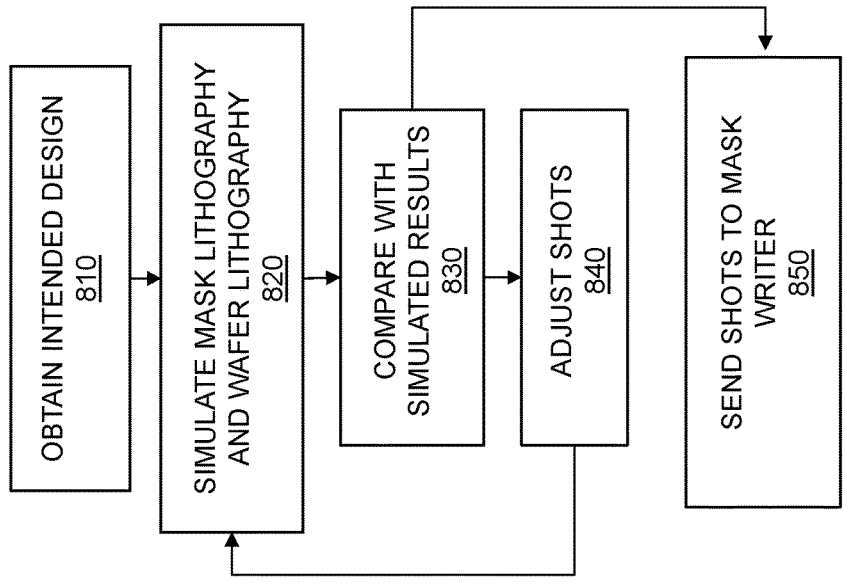
FIG. 8 is a flow diagram showing shot optimization.

FIG. 8 is a flow diagram showing shot optimization. The flow 800 includes obtaining an intended design 810. The design can be in any form, but can include a layout. The layout of the intended design can include desired fabricated shapes. Clusters of shots representing the desired fabricated shapes can be generated using any method, including, but not limited to, any method discussed herein. The flow 800 continues by simulating mask lithography and wafer lithography 820 using the clusters of shots to determine simulated lithographic shapes, and then comparing the desired fabricated shapes with the simulation results 830. If the results are not close enough to the intended design to meet design requirements, the shots can be adjusted 840, the new shots run through the simulator 820 and re-compared to the desired fabricated shapes 830 until the simulation results are close enough to the intended design to meet design requirements. Thus, the flow 800 can include modifying the shots to make the resulting fabricated semiconductor layout be closer to the desired fabricated shape.

Once the simulation results are close enough to the intended design to meet requirements, the shots can be sent to a mask-writer 850. The mask-writer can be used to fabricate semiconductor chips. Various steps in the flow 800 may be changed in order, repeated, omitted, or the like without departing from the disclosed concepts. Various embodiments of the flow 800 may be included in a computer program product embodied in a non-transitory computer readable medium that includes code executable by one or more processors.

Figure 9:
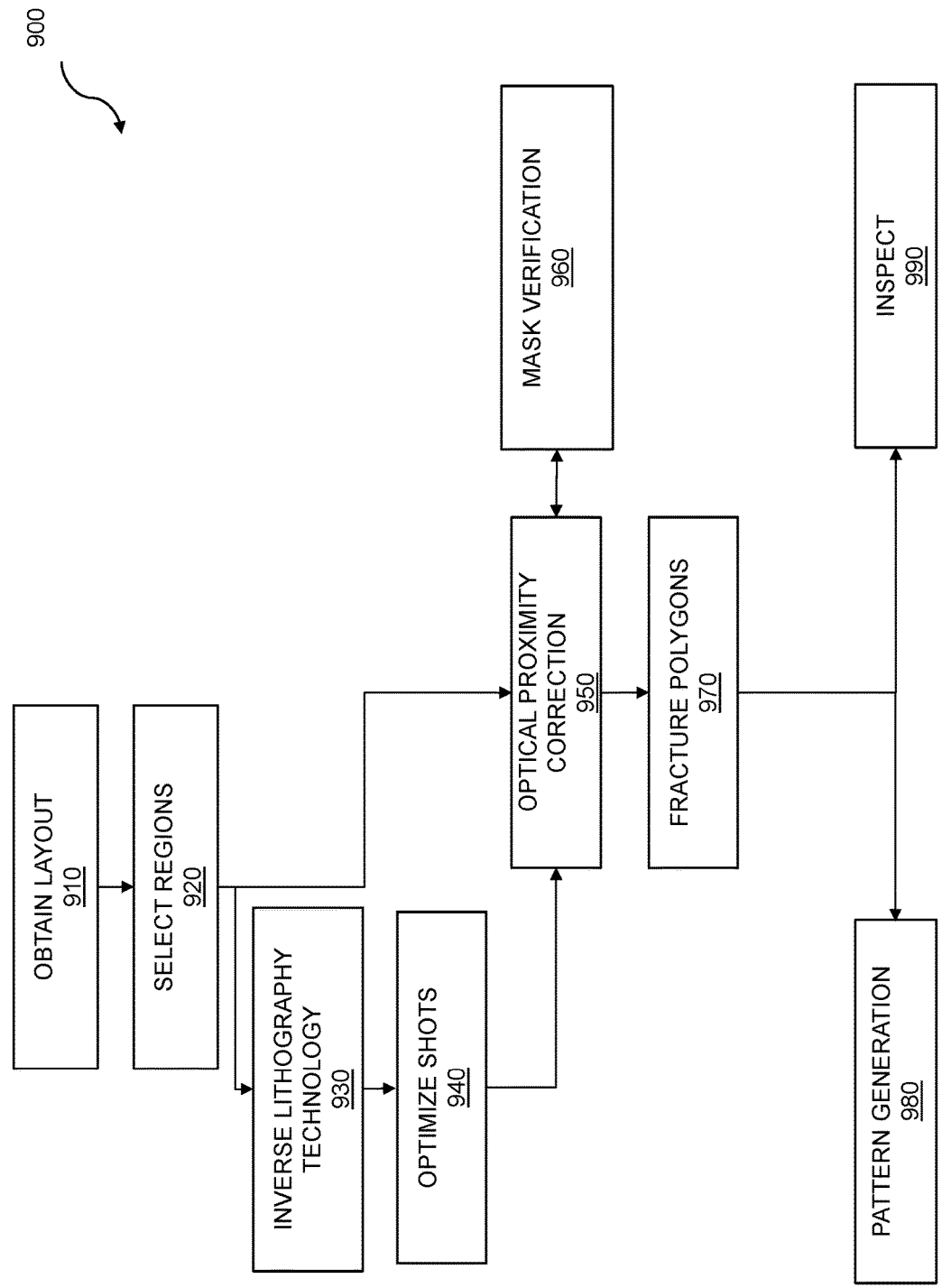
FIG. 9 is flow diagram for ILT/OPC usage.

FIG. 9 is a flow diagram for ILT/OPC usage. The flow 900 includes obtaining a layout 910. The layout can include desired fabricated shapes. Shots can be generated to represent the desired fabricated shapes. The flow 900 continues by selecting regions 920 of the layout for various processes. The flow 900 can include applying inverse lithography technology (ILT) 930 to at least some regions of the layout. The results of the ILT can be used to optimize shots 940. Some regions might not have ILT applied, depending on the embodiment.

The flow 900 continues by applying optical proximity correction (OPC) 950 to the various regions. The shots can be further modified based on the results of OPC. Thus, modifying the shots can occur based on an optical proximity correction calculation. The mask can be verified 960 to ensure that the various modifications by ILT and/or OPC have not violated design rules for the mask or masks.

The flow 900 can continue by fracturing polygons 970, in some embodiments. If polygons were used to represent the desired fabricated shapes, they are fractured into rectangular shots that are useable by a mask-writer. The shots are then used for pattern generation 980 to create a mask, which can be inspected 990 for defects. Various steps in the flow 900 may be changed in order, repeated, omitted, or the like without departing from the disclosed concepts. Various embodiments of the flow 900 may be included in a computer program product embodied in a non-transitory computer readable medium that includes code executable by one or more processors.

Figure 10:
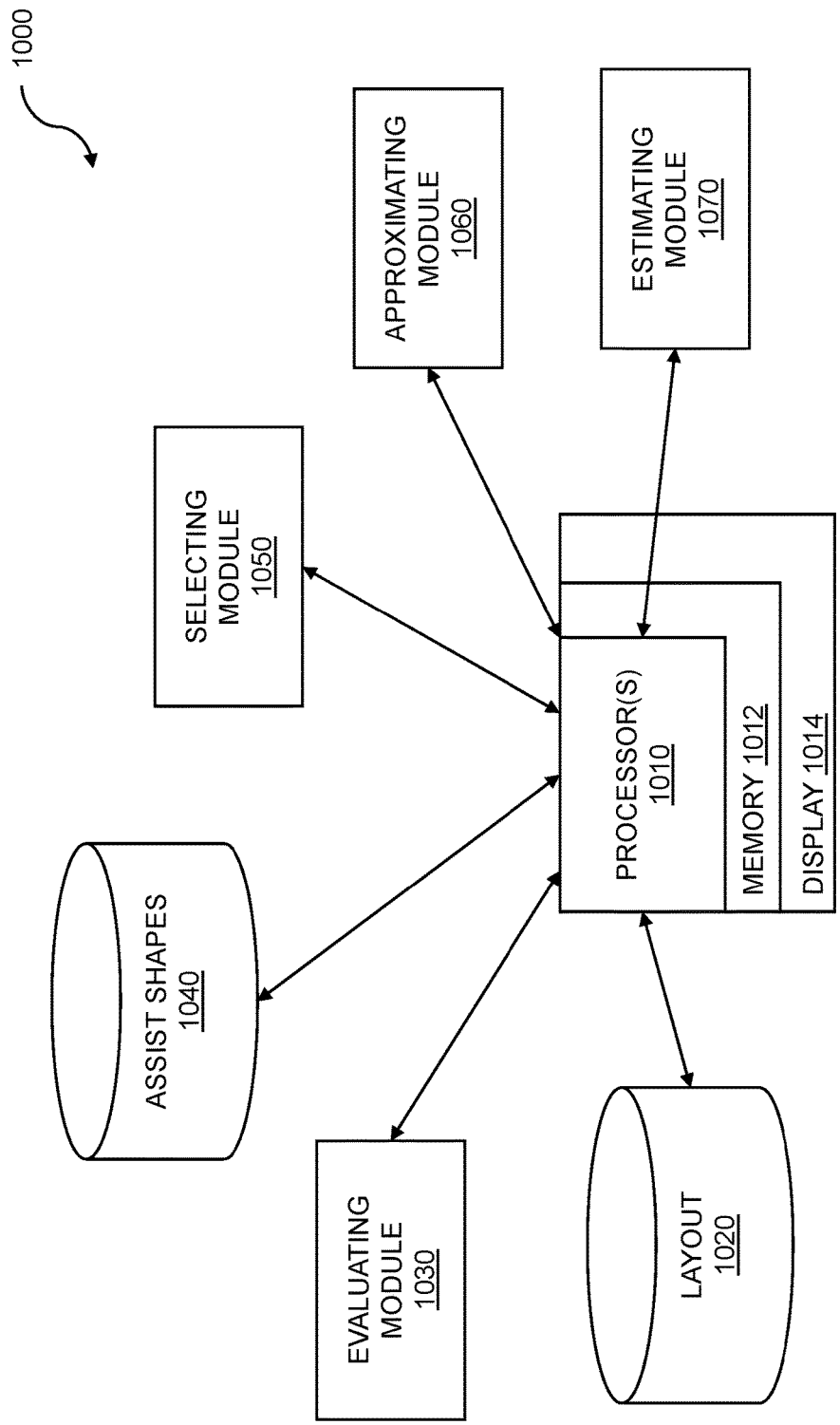
FIG. 10 is a system diagram for shot optimization.

FIG. 10 is a system diagram for shot optimization. The system 1000 includes one or more processors 1010 coupled to a memory 1012 which can be used to store computer code instructions and/or data, such as optics information, mask information, layer information, design data, instructions, system support data, intermediate data, analysis results, and the like. A display 1014 can also be included which can be any electronic display, including but not limited to, a computer display, a laptop screen, a net-book screen, a tablet screen, a cell phone display, a mobile device display, a remote with a display, a television, a projector, or the like. A layout of a design 1020 which can include one or more desired shapes can be stored on a computer disk or another computer storage medium and can be imported for analysis. An evaluating module 1030 can be included in the system 1000 to evaluate the layout 1020 to determine mask shapes and to determine a desired fabricated shape corresponding to the semiconductor design layout. Assist shapes 1040, describing shapes that can be useful in generating desired shapes for the layout 1020 as determined by the evaluating module 1030, can also be stored on a computer disk or other computer storage medium. A selecting module 1050 can be included to establish a shot density for shots used to generate the mask shapes. An approximating module 1060 can be included to approximate mask shapes using the shots. An estimating module 1070 can be included to estimate a resulting fabricated semiconductor layout based on the shots, and modify the shots to render the resulting fabricated semiconductor layout closer to the desired fabricated shape. In at least one embodiment, the functions of the evaluating module 1030, the selecting module 1050, the approximating module 1060, and/or the estimating module 1070 are accomplished by the one or more processors 1010.

The system 1000 can include a computer program product for shape analysis. The computer program product can be embodied in a non-transitory computer readable medium and can comprise code for obtaining a semiconductor design layout, code for determining a desired fabricated shape corresponding to the semiconductor design layout, code for evaluating the semiconductor design layout to determine mask shapes, code for establishing a shot density for shots used to generate the mask shapes, code for approximating mask shapes using the shots, code for estimating a resulting fabricated semiconductor layout based on the shots, and code for modifying the shots to make the resulting fabricated semiconductor layout to be closer to the desired fabricated shape.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for development, characterization, refinement and shape analysis of a semiconductor layout design, the method comprising:
    determining a desired fabricated shape based on the semiconductor design layout corresponding to a physical chip, wherein the desired fabricated shape corresponds to the semiconductor design layout;
    evaluating the semiconductor design layout to determine mask shapes, wherein the mask shapes are determined comprising analyzing the semiconductor design layout to evaluate desired fabricated shapes;
    generating, using one or more processors, shots based on the mask shapes, wherein the generating is accomplished by bypassing a polygon as an intermediate representation of the mask shapes;
    estimating a resulting fabricated semiconductor layout based on the shots;
    modifying the shots based on the mask shapes to make the resulting fabricated semiconductor layout to be closer to the desired fabricated shape; and
    storing information on the shots onto computer storage media.

2. The computer-implemented method of claim 1 further comprising establishing a shot density for shots used to generate the mask shapes.

3. The computer-implemented method of claim 2 wherein the mask shapes include an assist feature.

4. The computer-implemented method of claim 3 further comprising determining assist feature shapes to aid in fabrication of the desired fabricated shape.

5. The computer-implemented method of claim 4 wherein the establishing a shot density for shots is further based on the assist feature shapes.

6. The computer-implemented method of claim 5 wherein the assist feature includes a sub-resolution assist feature shape.

7. The computer-implemented method of claim 6 wherein the shots are used to generate the sub-resolution assist feature shape.

8. The computer-implemented method of claim 5 further comprising generating a semiconductor mask with the mask shapes based on the assist feature.

9. The computer-implemented method of claim 8 wherein the generating of the semiconductor mask is based on the shot density for the shots.

10. The computer-implemented method of claim 1 wherein the mask shapes include an assist feature which is determined comprising:
    selecting a glyph that approximates the assist feature; and
    placing the glyph within the mask shapes.

11. The computer-implemented method of claim 1 wherein the mask shapes include an assist feature which does not appear on a physical chip based on the semiconductor design layout.

12. The computer-implemented method of claim 1 wherein the modifying the shots occurs based on an optical proximity correction calculation.

13. The computer-implemented method of claim 12 wherein the optical proximity correction calculation occurs within a loop along with the estimating the resulting fabricated semiconductor layout and the modifying the shots.

14. The computer-implemented method of claim 1 further comprising obtaining a library of pre-determined shot clusters representing a plurality of assist shapes for the mask shapes.

15. The computer-implemented method of claim 14 further comprising selecting, from the library, an assist shape from the plurality of assist shapes where the assist shape is based on the desired fabricated shape.

16. The computer-implemented method of claim 1 wherein pre-determined shot clusters that comprise one or more mask shapes comprise glyphs.

17. The computer-implemented method of claim 1 further comprising controlling a variably shaped beam based on the shots.

18. The computer-implemented method of claim 1 further comprising determining a required minimum shot configuration for the shots.

19. The computer-implemented method of claim 1 further comprising correcting the shots to eliminate harmful artifacts.

20. The computer-implemented method of claim 19 further comprising modifying patterns for the shots at boundaries between adjacent glyphs.

21. The computer-implemented method of claim 1 further comprising characterizing the shots to generate pre-determined shot clusters.

22. The computer-implemented method of claim 21 further comprising storing the pre-determined shot clusters into a library.

23. The computer-implemented method of claim 22 wherein the generating allows shot configurations to overlap.

24. The computer-implemented method of claim 23 wherein the generating increases degrees of freedom for determining a minimum shot configuration.

25. The computer-implemented method of claim 1 further comprising:
   causing a mask set to be generated in accordance with the modified shots.

26. The computer-implemented method of claim 25 further comprising:
   causing the semiconductor design to be fabricated using the mask set.

27. A computational layout tool executing on a computer for development, characterization, refinement, and shape analysis of a semiconductor layout design, comprising:
   a memory which stores instructions;
   one or more processors coupled to the memory wherein the one or more processors are configured to:
   determine a desired fabricated shape based on the semiconductor design layout corresponding to a physical chip, wherein the desired fabricated shape corresponds to the semiconductor design layout;
   evaluate the semiconductor design layout to determine mask shapes, wherein the mask shapes are determined comprising analyzing the semiconductor design layout to evaluate desired fabricated shapes;
   generate shots based on the mask shapes, wherein the generating is accomplished by bypassing a polygon as an intermediate representation of the mask shapes;
   estimate a resulting fabricated semiconductor layout based on the shots;
   modify the shots based on the mask shapes to make the resulting fabricated semiconductor layout to be closer to the desired fabricated shape; and
   store information on the shots onto computer storage media.

28. A computer program product embodied in a non-transitory computer readable medium, which when executed by a processor, causes the processor to perform development, characterization, refinement, and shape analysis of a semiconductor layout design, the computer program product comprising instructions that when executed cause the processor to:
   determine a desired fabricated shape based on the semiconductor design layout corresponding to a physical chip, wherein the desired fabricated shape corresponds to the semiconductor design layout;
   evaluate the semiconductor design layout to determine mask shapes, wherein the mask shapes are determined comprising analyzing the semiconductor design layout to evaluate desired fabricated shapes;
   generate shots based on the mask shapes, wherein the generating is accomplished by bypassing a polygon as an intermediate representation of the mask shapes;
   estimate a resulting fabricated semiconductor layout based on the shots;
   modify the shots based on the mask shapes to make the resulting fabricated semiconductor layout to be closer to the desired fabricated shape; and
   store information on the shots onto computer storage media.

* * * * *